US012716952B2

(12) United States Patent
Kawahara et al.

(10) Patent No.: US 12,716,952 B2
(45) Date of Patent: Aug. 25, 2026

(54) BATTERY CHARACTERISTIC ESTIMATING DEVICE, BATTERY CHARACTERISTIC ESTIMATING METHOD, AND STORAGE MEDIUM

(71) Applicant: HONDA MOTOR CO., LTD., Tokyo (JP)

(72) Inventors: Takuma Kawahara, Wako (JP); Tatsuki Yamaguchi, Wako (JP); Yuki Sato, Utsunomiya (JP)

(73) Assignee: HONDA MOTOR CO., LTD., Tokyo (JP)

( * ) Notice: Subject to any disclaimer, the term of this patent is extended or adjusted under 35 U.S.C. 154(b) by 351 days.

(21) Appl. No.: 18/685,921

(22) PCT Filed: Sep. 28, 2022

(86) PCT No.: PCT/JP2022/036102
§ 371 (c)(1),
(2) Date: Feb. 23, 2024

(87) PCT Pub. No.: WO2023/054443
PCT Pub. Date: Apr. 6, 2023

(65) Prior Publication Data
US 2025/0180656 A1 Jun. 5, 2025

(30) Foreign Application Priority Data
Sep. 28, 2021 (JP) ................................ 2021-158238

(51) Int. Cl.
*G01R 31/3842* (2019.01)
*G01R 31/367* (2019.01)
(Continued)

(52) U.S. Cl.
CPC ....... *G01R 31/3842* (2019.01); *G01R 31/367* (2019.01); *G01R 31/374* (2019.01); *G01R 31/3828* (2019.01)

(58) Field of Classification Search
CPC ......... Y02E 60/10; Y02E 10/00; Y02E 20/00; Y02E 30/00; Y02E 40/00; Y02E 50/00;
(Continued)

(56) References Cited

U.S. PATENT DOCUMENTS

2013/0066573 A1* 3/2013 Bond .................. G01R 31/392 324/426
2016/0190549 A1* 6/2016 Ohara .................. H01M 4/525 429/223
(Continued)

FOREIGN PATENT DOCUMENTS

CN 112114254 12/2020
EP 1972955 9/2008
(Continued)

OTHER PUBLICATIONS

International Search Report and Written Opinion for International Application No. PCT/JP2022/036102 mailed on Dec. 20, 2022, 14 pages.

*Primary Examiner* — Daniel Previl
(74) *Attorney, Agent, or Firm* — Amin, Turocy & Watson, LLP

(57) ABSTRACT

A battery characteristic estimating device including: an acquisition unit configured to acquire time series data including at least a current value and a voltage value of a battery; a data filtering unit configured to extract data in which a voltage change due to charging/discharging is small from the acquired time series data as estimation data; and an OCV curve estimating unit configured to estimate an OCV curve representing an open circuit voltage for a discharge
(Continued)

capacity calculated on the basis of the current value of the battery on the basis of the estimation data extracted by the data filtering unit.

9 Claims, 10 Drawing Sheets

(51) Int. Cl.
*G01R 31/374* (2019.01)
*G01R 31/3828* (2019.01)

(58) Field of Classification Search
CPC ..... Y02E 60/00; Y02E 70/00; G01R 31/3648; G01R 31/367; G01R 31/374; G01R 31/392; G01R 31/382; G01R 31/3835; G01R 31/3842; G01R 31/385; G01R 31/388; G01R 19/10; G01R 31/3828; G01R 31/396; G01R 31/36; G01R 31/387; G01R 31/389; G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00; H01M 10/48; H01M 10/42; H01M 10/052; H01M 10/0525; H01M 10/4207; H01M 10/44; H01M 10/484; H01M 2004/021; H01M 4/131; H01M 4/364; H01M 4/505; H01M 4/525; H01M 4/587; H01M 50/124; H01M 50/129; H01M 50/457; H01M 50/491; H01M 10/06; H01M 10/4285; H01M 2220/20; H01M 4/00; H01M 6/00; H01M 8/00; H01M 10/00; H01M 12/00; H01M 14/00; H01M 16/00; H01M 2200/00; H01M 50/00; H01M 2250/00; H01M 2220/00; H01M 2300/00; H02J 7/00; H02J 7/82; H02J 1/00; H02J 3/00; H02J 4/00; H02J 9/00; H02J 11/00; H02J 13/00; H02J 15/00; H02J 50/00; H02J 2101/00; H02J 2103/00; H02J 2105/00; H02J 2107/00; H02J 2207/00; Y02T 10/70; Y02T 10/00; Y02T 30/00; Y02T 50/00; Y02T 70/00; Y02T 90/00; B60L 58/13; B60L 1/00; B60L 3/00; B60L 5/00; B60L 7/00; B60L 8/00; B60L 9/00; B60L 13/00; B60L 15/00; B60L 50/00; B60L 53/00; B60L 55/00; B60L 58/00; B60L 2200/00; B60L 2210/00; B60L 2220/00; B60L 2240/00; B60L 2250/00; B60L 2260/00; B60L 2270/00; G01B 21/32; G01B 1/00; G01B 3/00; G01B 5/00; G01B 7/00; G01B 9/00; G01B 11/00; G01B 13/00; G01B 15/00; G01B 17/00; G01B 21/00; G01B 2210/00; G01B 2290/00; G06F 17/00; G06F 1/00; G06F 3/00; G06F 5/00; G06F 7/00; G06F 8/00; G06F 9/00; G06F 11/00; G06F 12/00; G06F 13/00; G06F 15/00; G06F 16/00; G06F 18/00; G06F 30/00; G06F 21/00; G06F 40/00; G06F 2101/00; G06F 2111/00; G06F 2113/00
USPC ..... 340/455, 463, 472, 488, 538.12, 538.14, 340/539.22, 539.3, 552, 588, 636.1, 340/636.12–636.15, 636.19
See application file for complete search history.

(56) References Cited

U.S. PATENT DOCUMENTS

| | | | | |
|---|---|---|---|---|
| 2017/0176540 | A1* | 6/2017 | Omi | H01M 10/48 |
| 2020/0393518 | A1* | 12/2020 | Takegami | G01R 31/367 |
| 2021/0116511 | A1* | 4/2021 | Tajima | G01R 31/367 |
| 2022/0009352 | A1 | 1/2022 | Shiraishi et al. | |
| 2023/0065968 | A1 | 3/2023 | Nishikawa et al. | |

FOREIGN PATENT DOCUMENTS

| | | |
|---|---|---|
| JP | 2011-215151 | 10/2011 |
| JP | 2012-251806 | 12/2012 |
| JP | 2015-224919 | 12/2015 |
| JP | 2016-045025 | 4/2016 |
| JP | 2019-184581 | 10/2019 |
| WO | 2020/100896 | 5/2020 |
| WO | 2021/166465 | 8/2021 |

* cited by examiner

| time_stamp | VOLTAGE | CURRENT | TEMPERATURE | LOW CURRENT CONTINUATION TIME | OCV DETERMINATION RESULT | ... |
|---|---|---|---|---|---|---|
| 2020-04-05 22:29:08 | 3.6771 | -2.17 | 19.5 | 3.0 | False | ... |
| 2020-04-05 22:29:11 | 3.6429 | 0.67 | 19.5 | 6.0 | False | ... |
| 2020-04-05 22:29:14 | 3.6585 | -2.83 | 19.5 | 9.0 | False | ... |
| 2020-04-05 22:29:18 | 3.6248 | -2.17 | 19.5 | 13.0 | True | ... |
| 2020-04-05 22:29:21 | 3.6310 | -4.33 | 19.5 | 16.0 | True | ... |
| 2020-04-05 22:29:24 | 3.4762 | 140.17 | 19.5 | 19.0 | False | ... |
| 2020-04-05 22:29:27 | 3.6429 | -1.67 | 19.5 | 0.0 | False | ... |
| 2020-04-05 22:29:30 | 3.6071 | -4.00 | 19.5 | 3.0 | False | ... |
| 2020-04-05 22:29:34 | 3.5714 | 28.83 | 19.5 | 7.0 | False | ... |
| 2020-04-05 22:29:37 | 3.5833 | 69.17 | 19.5 | 0.0 | False | ... |
| ... | ... | ... | ... | ... | ... | ... |

144

POSITIVE ELECTRODE OCP (V)
fca (x)
148
b:POSITIVE ELECTRODE SHIFT AMOUNT
a:POSITIVE ELECTRODE SCALING FACTOR
-0.1 0
0
1
X=ax+b
POSITIVE ELECTRODE OCP (V)
Fca (X)
148#
b
a+b
DISCHARGE CAPACITY (Ah)

FIG. 7

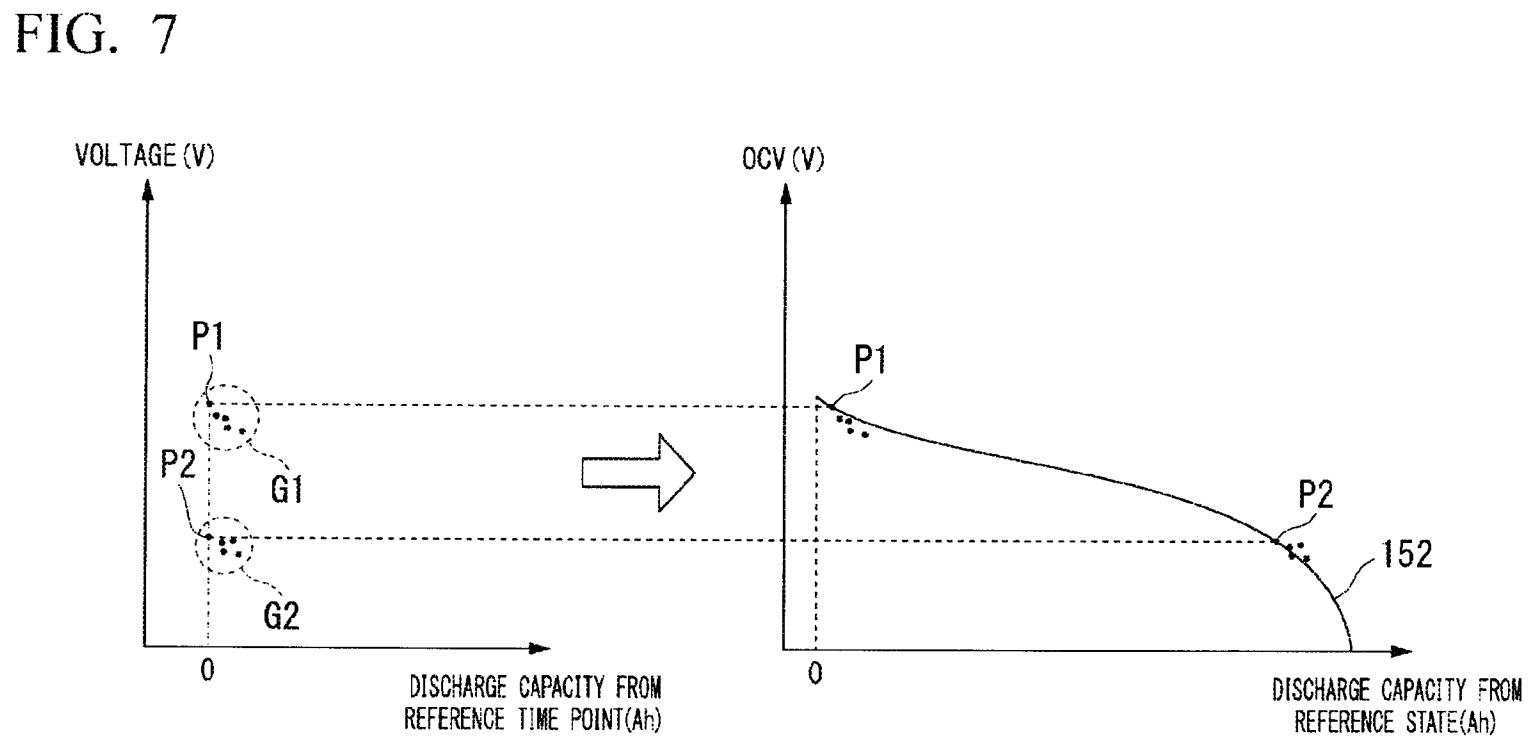

VOLTAGE (V)

DISCHARGE CAPACITY FROM REFERENCE TIME POINT(Ah)

P1

P2

G1

G2

0

OCV (V)

DISCHARGE CAPACITY FROM REFERENCE STATE(Ah)

Figure 10:
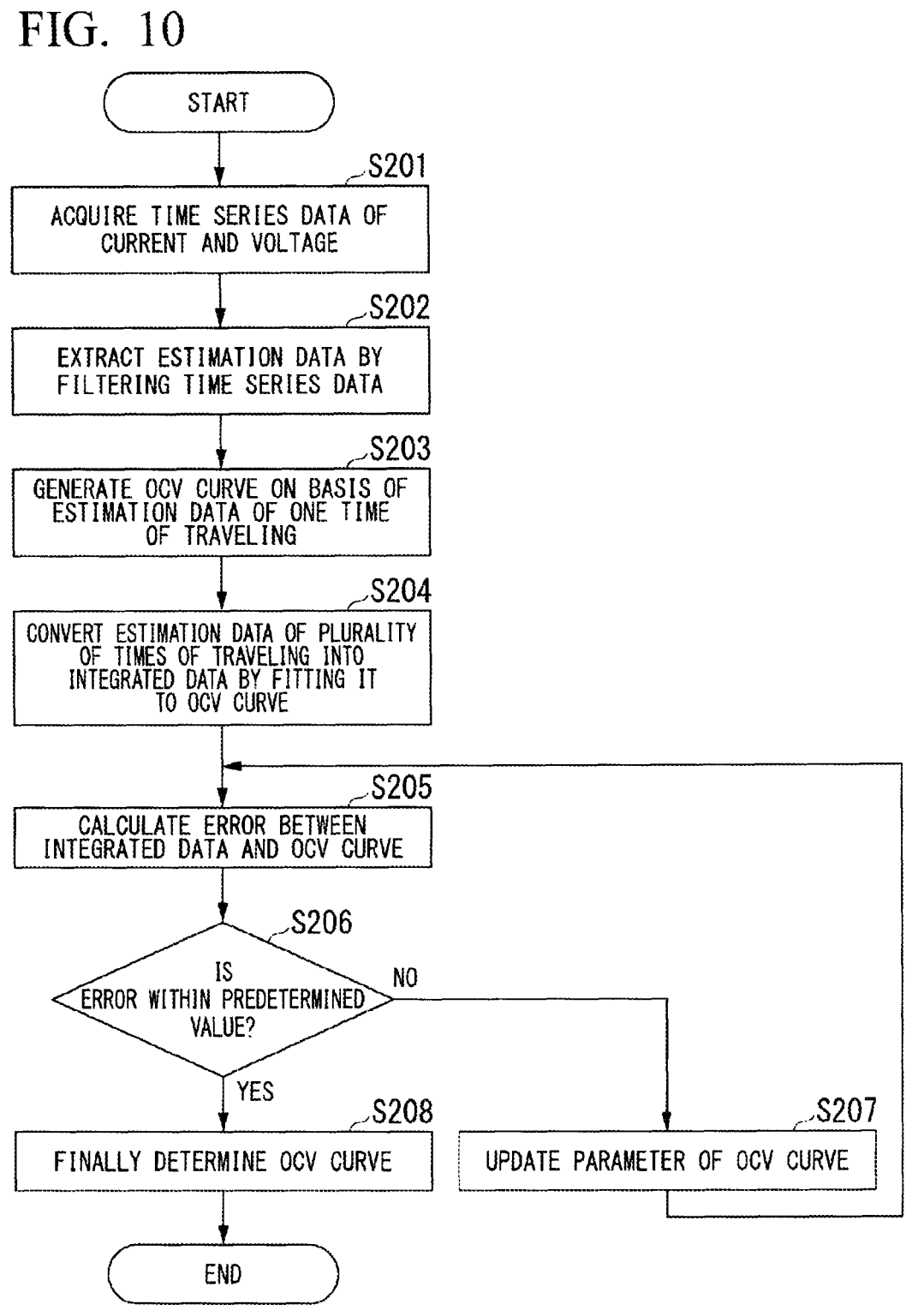

START

S201 ACQUIRE TIME SERIES DATA OF CURRENT AND VOLTAGE

S202 EXTRACT ESTIMATION DATA BY FILTERING TIME SERIES DATA

S203 GENERATE OCV CURVE ON BASIS OF ESTIMATION DATA OF ONE TIME OF TRAVELING

S204 CONVERT ESTIMATION DATA OF PLURALITY OF TIMES OF TRAVELING INTO INTEGRATED DATA BY FITTING IT TO OCV CURVE

S205 CALCULATE ERROR BETWEEN INTEGRATED DATA AND OCV CURVE

S206 IS ERROR WITHIN PREDETERMINED VALUE?

NO

S207 UPDATE PARAMETER OF OCV CURVE

YES

S208 FINALLY DETERMINE OCV CURVE

END

BATTERY CHARACTERISTIC ESTIMATING DEVICE, BATTERY CHARACTERISTIC ESTIMATING METHOD, AND STORAGE MEDIUM

TECHNICAL FIELD

The present invention relates to a battery characteristic estimating device, a battery characteristic estimating method, and a storage medium. Priority is claimed on Japanese Patent Application No. 2021-158238, filed Sep. 28, 2021, the content of which is incorporated herein by reference.

BACKGROUND ART

Conventionally, technologies for estimating deterioration states of batteries are known. For example, in Patent Document 1, a technology of calculating capacities of positive and negative electrode active materials, a charge amount, and a battery resistance on the basis of battery sensor data during charging and capacity-OCV curves of a positive electrode and a negative electrode and estimating degrees of deterioration of the positive and negative electrodes on the basis of the calculated values is disclosed.

CITATION LIST

Patent Document

[Patent Document 1]

Japanese Unexamined Patent Application, First Publication No. 2012-251806

SUMMARY OF INVENTION

Technical Problem

In the technology described in Patent Document 1, data during charging of a battery is used for an analysis. However, in a case in which data during charging is used for an analysis, there are cases in which characteristics of a battery cannot be estimated with high accuracy due to factors of deterioration of calculation accuracy of internal resistance and the like.

The present invention is in consideration of such situations, and one object thereof is to provide a battery characteristic estimating device, a battery characteristic estimating method, and a storage medium capable of estimating characteristics of a battery with high accuracy.

Solution to Problem

A battery characteristic estimating device, a battery characteristic estimating method, and a storage medium according to the present invention employ the following configurations.

(1): According to one aspect of the present invention, there is provided a battery characteristic estimating device including: an acquisition unit configured to acquire time series data including at least a current value and a voltage value of a battery; a data filtering unit configured to extract data in which a voltage change due to charging/discharging is small from the acquired time series data as estimation data; and an OCV curve estimating unit configured to estimate an OCV curve representing an open circuit voltage for a discharge capacity calculated on the basis of the current value of the battery on the basis of the estimation data extracted by the data filtering unit.

(2): In the aspect (1) described above, the OCV curve estimating unit estimates the OCV curve by performing optimization calculation such that a value of an error function calculated on the basis of the estimated OCV curve and the estimation data is a threshold or less, the error function is a function increasing in accordance with a sum value of values acquired by applying weights to errors between the estimated OCV curve and the estimation data, and a data number of pieces of the estimation data extracted by the data filtering unit is counted for a plurality of sections of a discharge capacity or a voltage value, and the weight is set such that a value of the weight corresponding to a section becomes smaller as the counted data number becomes larger.

(3): In the aspect (2) described above, a traveling data integrating unit configured to integrate the estimation data at times of a plurality of times of traveling of a vehicle in which the battery is mounted is further included, in which the traveling data integrating unit integrates the estimation data at the times of the plurality of times of traveling by estimating discharge capacity values of the estimation data of the plurality of times of traveling using an initial OCV curve or an OCV curve estimated from a data group at the time of specific traveling and a voltage value of a timing at which the voltage value can be regarded as an open circuit voltage at the times of the plurality of times of traveling, and the OCV curve estimating unit estimates the OCV curve by performing the optimization calculation such that the value of the error function representing the error between the estimated OCV curve and the estimation data integrated by the traveling data integrating unit is the threshold or less.

(4): In the aspect (1) described above, the data filtering unit extracts time series data in which a low current continuation time that is a time at which the current value represents a value equal to or smaller than a first threshold is a second threshold or more as the estimation data in which the voltage change is small.

(5): In the aspect (4) described above, the time series data includes a temperature of the battery, and the data filtering unit increases a value of the second threshold in a case in which the temperature is a third threshold or less.

(6): In the aspect (1) described above, the data filtering unit extracts time series data in which the current value is a fourth threshold or less as the estimation data in which the voltage change is small.

(7): In the aspect (1) described above, the data filtering unit extracts time series data in which a differential value of the voltage value is a fifth threshold or less as the estimation data in which the voltage change is small.

(8): According to another aspect of the present invention, there is provided a battery characteristic estimating method using a computer, the battery characteristic estimating method including: acquiring time series data including at least a current value and a voltage value of a battery; extracting data in which a voltage change due to charging/discharging is small from the acquired time series data as estimation data; and estimating an OCV curve representing an open circuit voltage for a discharge capacity calculated on the basis of the current value of the battery on the basis of the estimation data.

(9): According to another aspect of the present invention, there is provided a non-transitory computer-readable storage medium having stored thereon a program causing a computer to: acquire time series data including at least a current value and a voltage value of a battery; extract data in which a voltage change due to charging/discharging is small from the acquired time series data as estimation data; and estimate an OCV curve representing an open circuit voltage for a discharge capacity calculated on the basis of the current value of the battery on the basis of the estimation data.

Advantageous Effects of Invention

According to the aspects (1) to (9), the characteristics of a battery can be estimated with high accuracy.

According to the aspect (2), a deviation of fitting due to variations of a data amount can be inhibited.

According to the aspect (3), by integrating a plurality of times of traveling data of a vehicle, the characteristics of a battery can be estimated with further higher accuracy.

According to the aspects (4) to (7), by performing an optimization process only for data that can be regarded as an OCV, the characteristics of a battery can be estimated with further higher accuracy.

BRIEF DESCRIPTION OF DRAWINGS

FIG. 3 is a diagram illustrating one example of the configuration of time series data 142 and estimation data 144.

FIG. 7 is a diagram illustrating one example of a method for integrating estimation data 144 relating to a plurality of times of traveling of a vehicle 10 in integrated data 146.

FIG. 10 is a flowchart illustrating another example of the flow of a process performed by the battery characteristic estimating device 100.

DESCRIPTION OF EMBODIMENTS

Hereinafter, a battery characteristic estimating device, a battery characteristic estimating method, and a storage medium according to an embodiment of the present invention will be described with reference to the drawings.

[Configuration of Vehicle]

Figure 1:
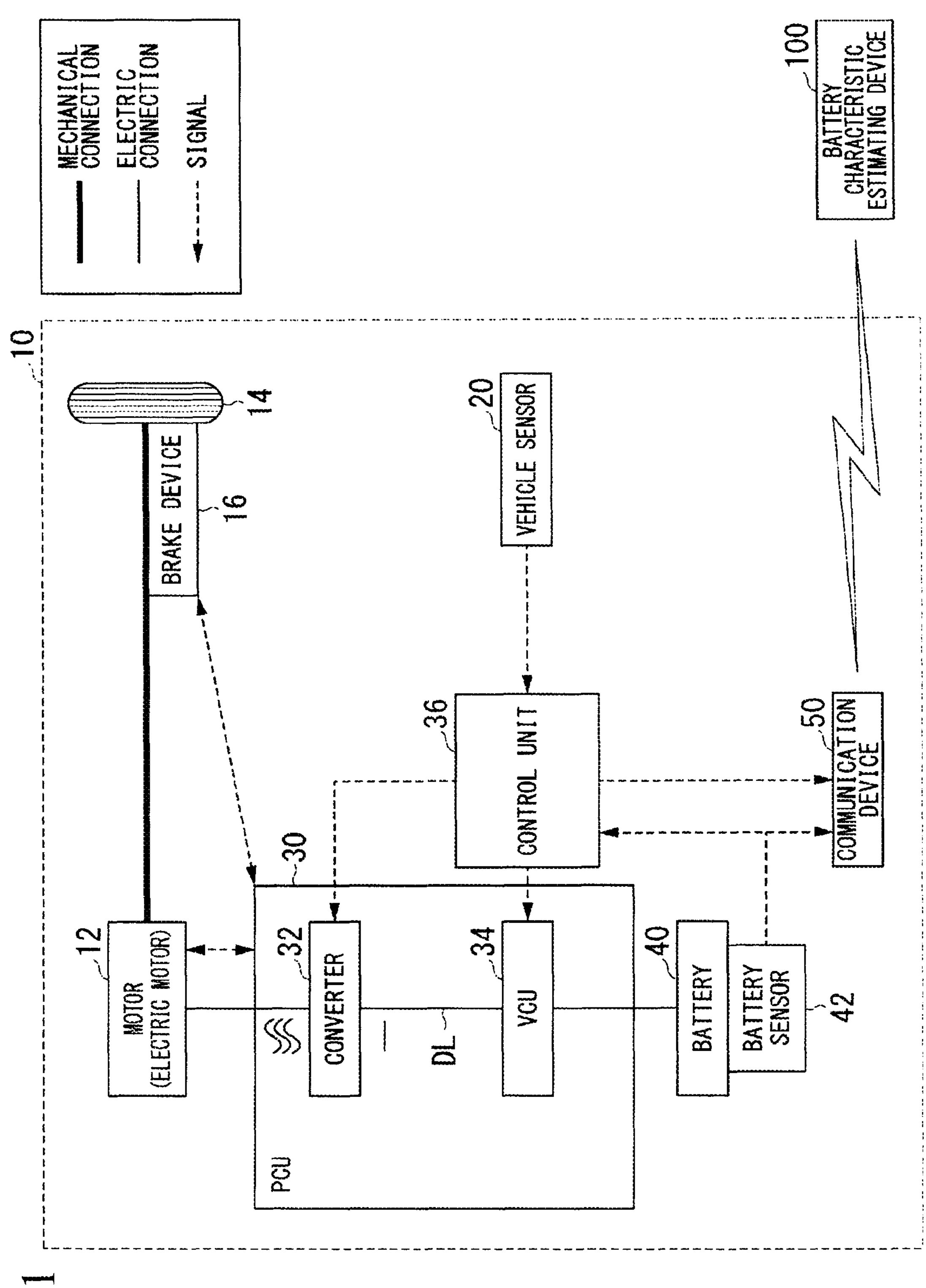
FIG. 1 is a diagram illustrating one example of the configuration of a vehicle 10 to which a battery characteristic estimating device 100 according to an embodiment is applied.

FIG. 1 is a diagram illustrating one example of the configuration of a vehicle 10 to which a battery characteristic estimating device 100 according to an embodiment is applied. The vehicle 10 illustrated in FIG. 1 is a battery electric vehicle (BEV) traveling using an electric motor driven using electric power supplied from a battery (a secondary battery) for traveling. As an alternative, the vehicle 10 may be a plug-in hybrid vehicle (PHV) or a plug-in hybrid electric vehicle (PHEV) in which an external charging function is included in a hybrid vehicle. In addition, the vehicle 10, for example, includes not only a four-wheel vehicle but also all types of moving object traveling using an electric motor driven using electric power supplied from a battery such as a two-wheel vehicle of a saddle-type, a three-wheel vehicle (including a vehicle of front two-wheel and a rear-one wheel other than front one-wheel and rear two-wheels), an assistant-type bicycle, or an electric boat.

A motor 12, for example, is a three-phase AC electric motor. A rotor of the motor 12 is connected to drive wheels 14. The motor 12 is driven using electric power supplied from a storage section (not illustrated) included in a battery 40 and delivers rotation power to the drive wheels 14. In addition, the motor 12 generates power using kinetic energy of the vehicle 10 at the time of deceleration of the vehicle 10.

A vehicle sensor 20, for example, includes an accelerator degree of opening sensor, a vehicle speed sensor, and a brake pedal pressure sensor. The accelerator degree of opening sensor is mounted in an accelerator pedal, detects an amount of user's operation on the accelerator pedal, and outputs the detected amount of operation to a control unit 36 to be described below as an accelerator degree of opening. The vehicle speed sensor, for example, includes a vehicle wheel speed sensor and a speed calculator that are mounted in each vehicle wheel of the vehicle 10, derives a speed of the vehicle 10 (a vehicle speed) by integrating vehicle wheel speeds detected by the vehicle wheel speed sensors, and outputs the vehicle speed to the control unit 36. The brake pedal pressure sensor is mounted in a brake pedal, detects an amount of driver's operation on the brake pedal, and outputs the detected amount of the operation to the control unit 36 as a brake pedal pressure.

A PCU 30, for example, includes a converter 32 and a voltage control unit (VCU) 34. In FIG. 1, a configuration in which such constituent elements are integrated as the PCU 30 is only one example, and such constituent elements in the vehicle 10 may be arranged to be distributed.

The converter 32, for example, is an AC-DC converter. ADC-side terminal of the converter 32 is connected to a DC link DL. The battery 40 is connected to the DC link DL through the VCU 34. The converter 32 converts an AC generated by the motor 12 into a DC and outputs the DC to the DC link DL.

The VCU 34, for example, is a DC-DC converter. The VCU 34 boosts electric power supplied from the battery 40 and outputs the boosted electric power to the DC link DL.

The control unit 36 controls driving of the motor 12 on the basis of an output from the accelerator degree of opening sensor included in the vehicle sensor 20. In addition, the control unit 36 controls a brake device 16 on the basis of an output from the brake pedal pressure sensor included in the vehicle sensor 20. Furthermore, the control unit 36, for example, calculates a state of charge (SOC; hereinafter also referred to as a "battery charging rate") of the battery 40 on the basis of an output from a battery sensor 42, which will be described below, connected to the battery 40 and outputs the SOC to the VCU 34. The VCU 34 raises the voltage of the DC link DL in accordance with an instruction from the control unit 36.

The battery 40, for example, is a secondary battery such as a lithium-ion battery that can repeat charging and discharging. A positive electrode active material composing a positive electrode of the battery 40, for example, is a material containing at least one of materials such as nickel cobalt manganese (NCM), nickel cobalt aluminum (NCA), lithium ferrophosphate (LFP), lithium manganese oxide (LMO), and the like, and a negative electrode active material composing a negative electrode of the battery 40, for example, is a material containing at least one of materials such as hard carbon, graphite, and the like. In addition, the battery 40 is mounted to be freely attachable/detachable for the vehicle 10 and, for example, may be a battery pack of a cassette type. The battery 40 stores electric power supplied from an external charger (not illustrated) of the vehicle 10 and performs discharging for traveling of the vehicle 10.

The battery sensor 42 detects physical quantities such as a current, a voltage, a temperature, and the like of the battery 40. The battery sensor 42, for example, includes a current sensor, a voltage sensor, and a temperature sensor. The battery sensor 42 detects a current of a secondary battery composing the battery 40 (hereinafter, simply referred to as "battery 40") using the current sensor, detects a voltage of the battery 40 using the voltage sensor, and detects a temperature of the battery 40 using the temperature sensor. The battery sensor 42 outputs data of physical quantities such as a current value, a voltage value, a temperature, and the like of the battery 40 which have been detected to the control unit 36 and a communication device 50.

The communication device 50 includes a radio module used for connection to a cellular network and a Wi-Fi network. The communication device 50 may include a radio module for using Bluetooth (registered trademark) and the like. The communication device 50 transmits/receives various kinds of information relating to the vehicle 10, for example, to/from a battery characteristic estimating device 100 using communication of radio modules. The communication device 50 transmits data of physical quantities of the battery 40 output by the control unit 36 or the battery sensor 42 to the battery characteristic estimating device 100. The communication device 50 receives information representing characteristics of the battery 40 that have been diagnosed and transmitted by the battery characteristic estimating device 100 to be described below and may output the received information representing the characteristics of the battery 40 to an HMI (not illustrated) of the vehicle 10.

[Configuration of Battery Characteristic Estimating Device]

Figure 2:
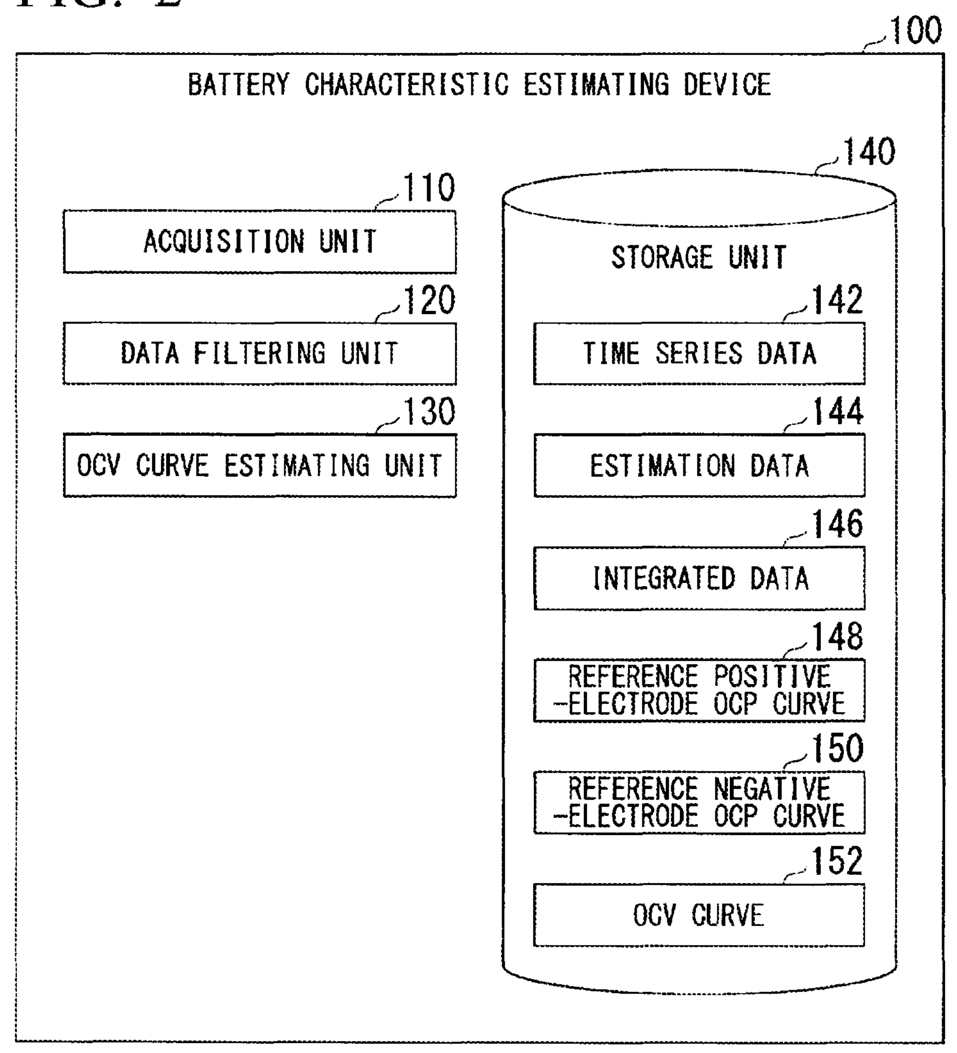
FIG. 2 is a diagram illustrating one example of the configuration of the battery characteristic estimating device 100 according to the embodiment.

Next, one example of the battery characteristic estimating device 100 that estimates characteristics of the battery 40 of the vehicle 10 will be described. FIG. 2 is a diagram illustrating one example of the configuration of the battery characteristic estimating device 100 according to an embodiment. The battery characteristic estimating device 100, for example, includes an acquisition unit 110, a data filtering unit 120, an OCV curve estimating unit 130, and a storage unit 140. The acquisition unit 110, the data filtering unit 120, and the OCV curve estimating unit 130, for example, are realized by a hardware processor such as central processing unit (CPU) executing a program (software). Some or all of such constituent elements may be realized by hardware (a circuit unit; including circuitry) such as a large scale integration (LSI), an application specific integrated circuit (ASIC), a field-programmable gate array (FPGA), and a graphics processing unit (GPU) or may be realized by software and hardware in cooperation. A program may be stored in advance in a storage device (a storage device including a non-transitory storage medium) such as a hard disk drive (HDD) or a flash memory or may be stored in a storage medium (a non-transitory storage medium) that can be loaded or unloaded such as a DVD or a CD-ROM and be installed by loading the storage medium in a drive device. The storage unit 140, for example, is an HDD, a flash memory, a random access memory (RAM), or the like. The storage unit 140, for example, stores time series data 142, estimation data 144, integrated data 146, a reference positive-electrode OCP curve 148, a reference negative-electrode OCP curve 150, and an OCV curve 152.

The acquisition unit 110 acquires time series data of a current value, a voltage value, a temperature, and the like of the battery 40 from the communication device 50 using a communication interface, which is not illustrated, mounted in the battery characteristic estimating device 100 and stores the acquired time series data in a storage unit 140 as time series data 142. In addition, the acquisition unit 110 calculates a discharge capacity (amount of discharging) by accumulating current values included in the acquired time series data and stores the discharge capacity in the storage unit 140 as time series data 142. At this time, the acquisition unit 110 may perform a process of excluding data in which a loss or an abnormality has occurred from the acquired time series data. In addition, the discharge capacity may be calculated on the vehicle 10 side and then transmitted to the battery characteristic estimating device 100 through the communication device 50 instead of being calculated by the battery characteristic estimating device 100.

The data filtering unit 120 extracts data of which a voltage change due to charging/discharging is small, in other words, data of which the voltage change is a predetermined value or less, from the time series data 142 stored in the storage unit 140 as estimation data 144. FIG. 3 is a diagram illustrating one example of the configuration of the time series data 142 and the estimation data 144. In FIG. 3, time_stamp represents a date and time at which data corresponding to each record of the time series data 142 was measured by the vehicle 10, a voltage represents a voltage value of the battery 40, a current represents a current value of the battery 40, a low-current continuation time represents a period in which a state, in which the current value of the battery 40 was a first threshold (for example, 5 A) or less, was continued, and an OCV determination result represents a result of determination on whether or not a corresponding voltage value can be regarded as an open circuit voltage (OCV).

The data filtering unit 120, for example, determines that, for time series data in which a low current continuation time is a second threshold (for example, 10 seconds) or more out of the time series data 142, a corresponding voltage value can be regarded as the OCV and sets the OCV determination result as True. In FIG. 3, a record in which the OCV determination result is set to True corresponds to the estimation data 144. By performing not only determination relating to a current value but also determination relating to a low-current continuation time, the influence of a response delay of a circuit is reduced, and a voltage value that can be regarded as the OCV can be extracted more reliably. At this time, in a case in which the temperature of the battery is a third threshold or less, the data filtering unit 120 may increase the value of the second threshold. In other words, in a case in which the temperature of the battery is low, the data filtering unit 120 may increase the threshold of the low-current continuation time for which the voltage value can be regarded as the OCV. The reason for this is that, in a case in which the temperature of the battery is low, a period until the voltage value converges tends to be long.

In addition, the data filtering unit 120, for example, may determine that a corresponding voltage value can be regarded as the OCV for time series data in which a current value is a fourth threshold or less out of the time series data 142 and set the OCV determination result to True or may determine that a corresponding voltage value can be regarded as the OCV by calculating a voltage differential value and determining whether or not this voltage differential value is a fifth threshold or less. Furthermore, the data filtering unit 120 may directly calculate an amount of change of the voltage value and determine that time series data for which the calculated amount of change is a predetermined value or less is data that can be regarded to be the OCV. The data filtering unit 120 stores the estimation data 144 extracted from the time series data 142 in the storage unit 140.

The OCV curve estimating unit 130 converts a reference positive-electrode OCP curve 148 into a positive-electrode OCP curve 148# representing a change of an open circuit electric potential with respect to a discharge capacity of the positive electrode in accordance with a first parameter group to be described below, converts a reference negative-electrode OCP curve 150 into a negative-electrode OCP curve 150# representing a change of an open circuit electric potential with respect to a discharge capacity of the negative electrode in accordance with a second parameter group to be described below, and estimates an OCV curve 152 representing a change of the open circuit voltage with respect to a capacity change of the battery 40 by subtracting the negative-electrode OCP curve 150# from the positive-electrode OCP curve 148# acquired through the conversion.

The OCV curve estimating unit 130 optimizes the OCV curve 152 such that a value of an error function calculated on the basis of the estimated OCV curve 152 and the estimation data 144 extracted by the data filtering unit 120 is a threshold or less. The OCV curve 152 that has been optimized in this way finally represents estimated characteristics of the battery 40. A specific optimization process of the OCV curve 152 will be described below.

Figure 4:
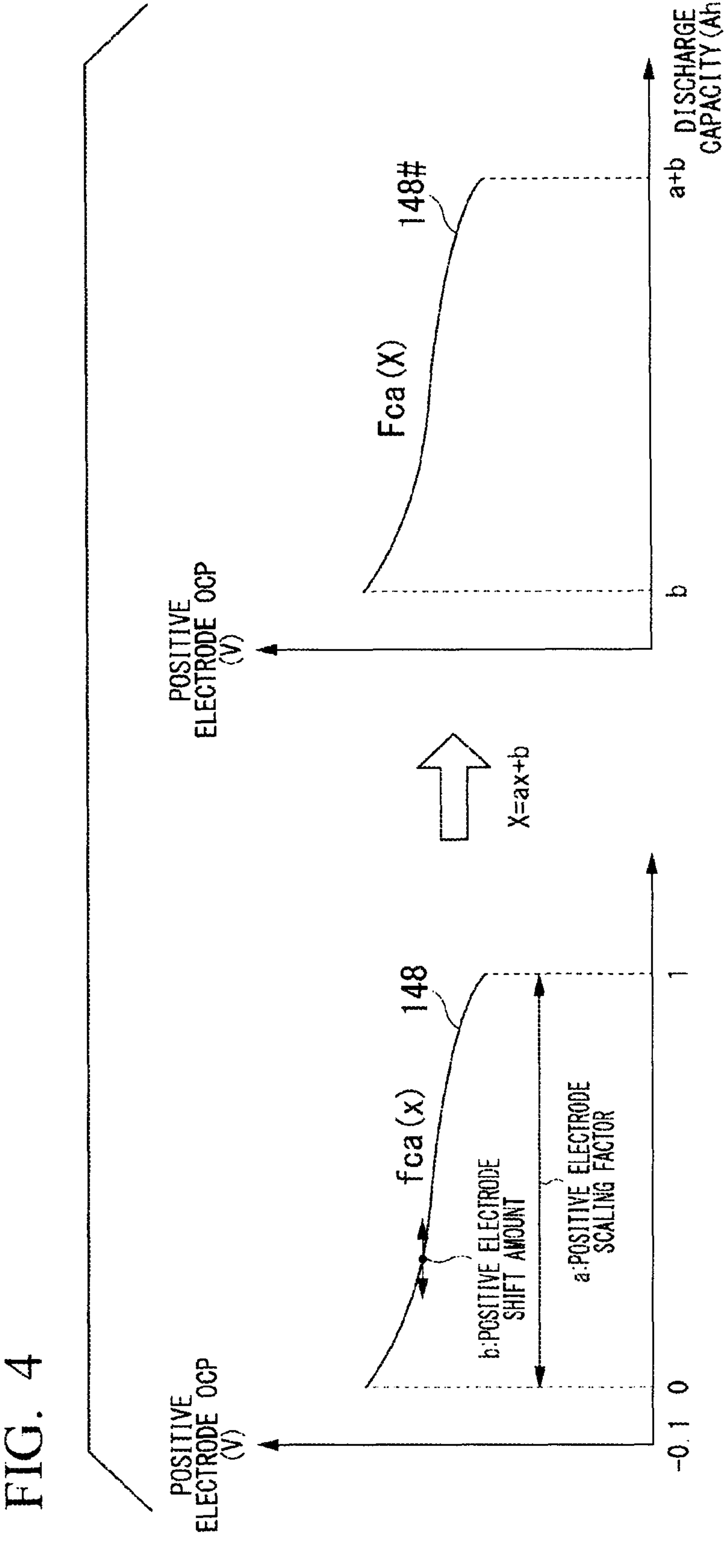
FIG. 4 is a diagram illustrating one example of a reference positive-electrode open circuit potential (OCP) curve 148 and a positive-electrode OCP curve 148# acquired by converting the reference positive-electrode OCP curve 148.

FIG. 4 is a diagram illustrating one example of a reference positive-electrode OCP curve 148 and a positive-electrode OCP curve 148# acquired by converting the reference positive-electrode OCP curve 148. A left part of FIG. 3 represents the reference positive-electrode OCP curve 148, and a right part of FIG. 3 represents the positive-electrode OCP curve 148# acquired by converting the reference positive-electrode OCP curve 148.

As illustrated in the left part of FIG. 4, the reference positive-electrode OCP curve 148 represents a mathematical model $f_{ca}(x)$ that becomes a reference for deriving the positive-electrode OCP curve 148# representing a change of the open circuit electric potential with respect to the discharge capacity of the positive electrode, and a width of the discharge capacity x is normalized to 1. The OCV curve estimating unit 130 converts the reference positive-electrode OCP curve 148 into the positive-electrode OCP curve 148# by using a positive electrode scaling factor a for converting the normalized width of the discharge capacity of the positive electrode into a width of an actual discharge capacity and a positive-electrode shift amount b that is an amount of shift from the reference positive-electrode OCP curve 148 to the positive-electrode OCP curve 148# in a discharge capacity direction.

More specifically, the OCV curve estimating unit 130 obtains the mathematical model $F_{ca}(X)$ representing the positive-electrode OCP curve 148# by converting x that is a variable of no dimension into a variable X having the dimension of the discharge capacity (Ah) using $X=ax+b$ and substituting $x=(X-b)/a$ into $f_{ca}(x)$. In this way, the positive-electrode scaling factor a and the positive-electrode shift amount b represent one example of "first parameter group".

Figure 5:
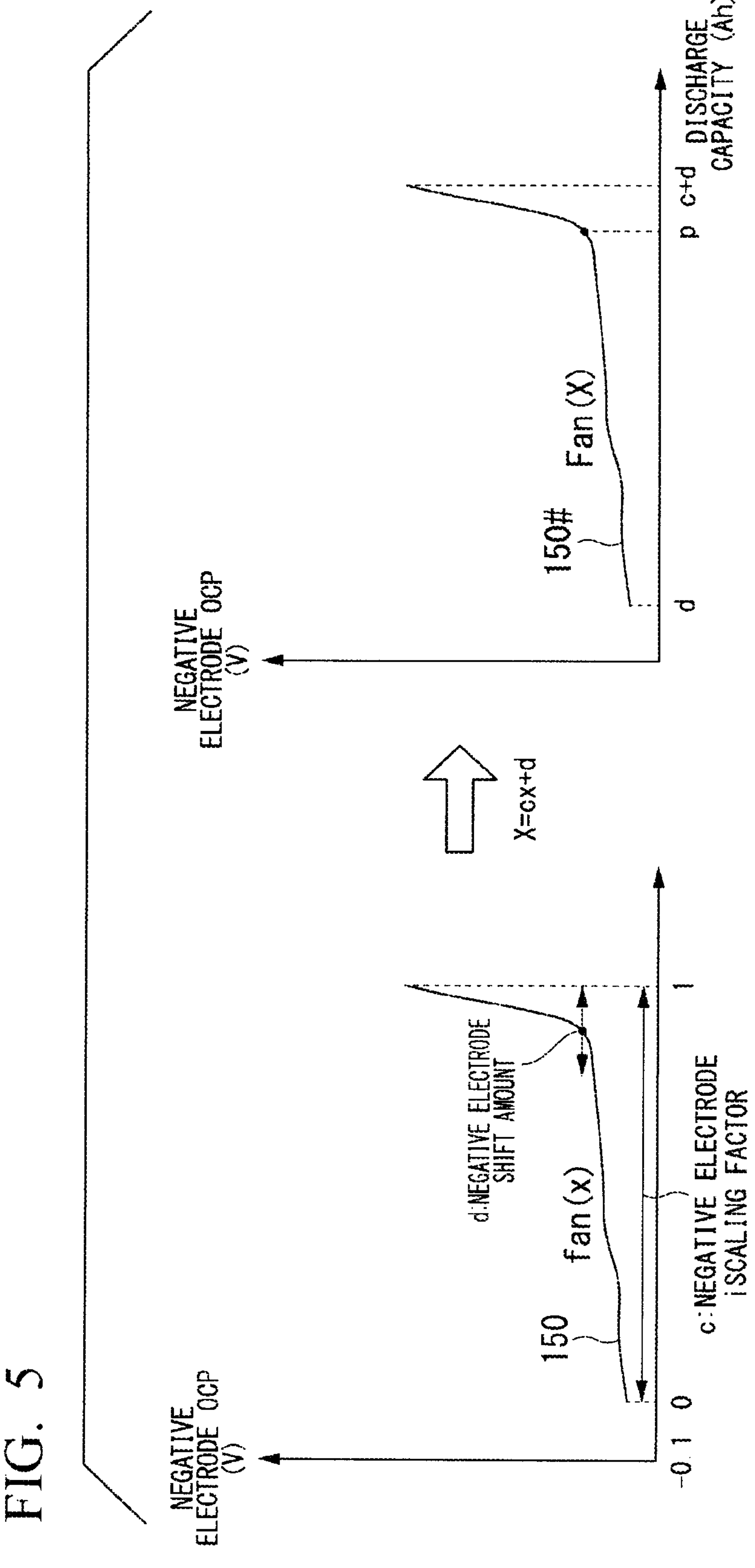
FIG. 5 is a diagram illustrating one example of a reference negative-electrode OCP curve 150 and a negative-electrode OCP curve 150# acquired by converting the reference negative-electrode OCP curve 150.

FIG. 5 is a diagram illustrating one example of a reference negative-electrode OCP curve 150 and a negative-electrode OCP curve 150# acquired by converting the reference negative-electrode OCP curve 150. A left part of FIG. 4 represents the reference negative-electrode OCP curve 150, and a right part of FIG. 4 represents the negative-electrode OCP curve 150# acquired by converting the reference negative-electrode OCP curve 150.

As illustrated in the left part of FIG. 5, the reference negative-electrode OCP curve 150 represents a mathematical model $f_{an}(x)$ that becomes a reference for deriving the negative-electrode OCP curve 150# representing a change of the open circuit electric potential with respect to the discharge capacity of the negative electrode, and a width of the discharge capacity x is normalized to 1. The OCV curve estimating unit 130 converts the reference negative-electrode OCP curve 150 into the negative-electrode OCP curve 150# by using a negative electrode scaling factor c for converting the normalized width of the discharge capacity of the negative electrode into a width of an actual discharge capacity and a negative-electrode shift amount d that is an amount of shift from the reference negative-electrode OCP curve 150 to the negative-electrode OCP curve 150# in a discharge capacity direction.

More specifically, the OCV curve estimating unit 130 obtains the mathematical model $F_{an}(X)$ representing the negative-electrode OCP curve 150# by converting x that is a variable of no dimension into a variable X having the dimension of the discharge capacity (Ah) using $X=cx+d$ and substituting $x=(X-d)/c$ into $f_{an}(x)$. In this way, the negative-electrode scaling factor c and the negative-electrode shift amount d represent one example of "second parameter group".

In FIGS. 3 and 4, as one example, the reference positive-electrode OCP curve 148 and the reference negative-electrode OCP curve 150 have the widths of the discharge capacity x being normalized to 1. However, the present invention is not limited to such a configuration, and more generally, the reference positive-electrode OCP curve 148 and the reference negative-electrode OCP curve 150 may be standardized to an arbitrary value as long as there is a mathematical model functioning as a reference for optimizing the first parameter group and the second parameter group.

Figure 6:
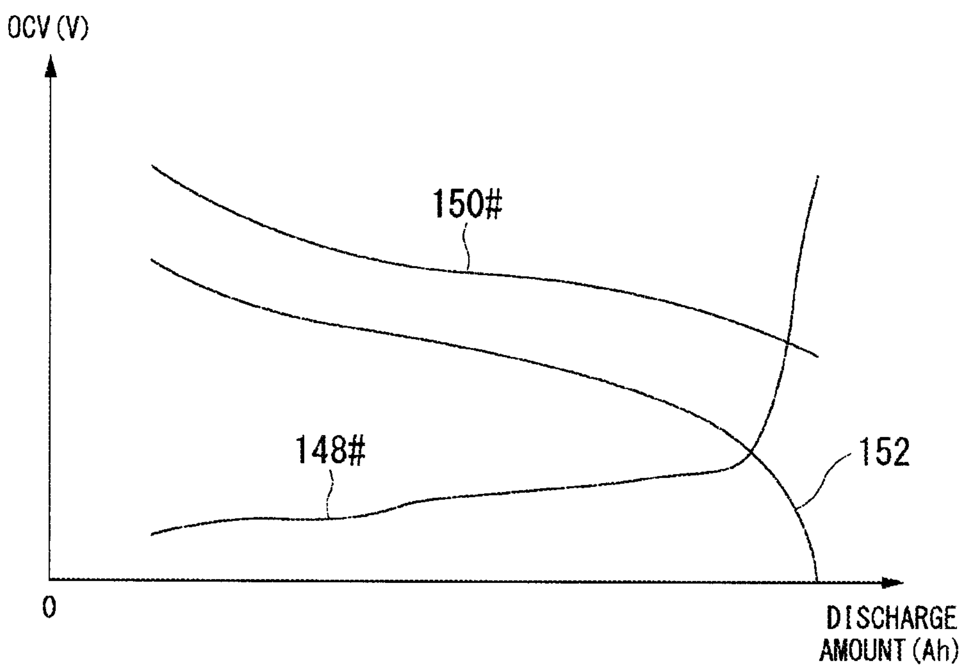
FIG. 6 is a diagram illustrating one example of an OCV curve 152 derived on the basis of the positive-electrode OCP curve 148# and the negative-electrode OCP curve 150#.

FIG. 6 is a diagram illustrating one example of an OCV curve 152 derived on the basis of the positive-electrode OCP curve 148# and the negative-electrode OCP curve 150#. As illustrated in FIG. 6, the OCV curve estimating unit 130 estimates the OCV curve 152 by subtracting the negative-electrode OCP curve 150# acquired in FIG. 6 from the positive-electrode OCP curve 148# acquired in FIG. 4. Next, the OCV curve estimating unit 130 optimizes the first parameter group and the second parameter group such that a value of an error function representing an error between the estimated OCV curve 152 and integrated data 146 acquired by integrating estimation data 144 relating to a plurality of number of times of traveling of the vehicle 10 is a threshold value or less.

FIG. 7 is a diagram illustrating one example of a method for integrating estimation data 144 relating to a plurality of times of traveling of a vehicle 10 in integrated data 146. In FIG. 7, each of G1 and G2 represents a set of estimation data 144 relating to a plurality of times of traveling of the vehicle 10. A point P1 of the set G1 and a point P2 of the set G2 represent a combination of a voltage and a discharge capacity at the traveling start time of respective traveling.

As illustrated in a left part of FIG. 7, a discharge capacity stored as the time series data 142 is a value measured with a traveling start time point defined as 0 Ah and this traveling start time point set as a reference time point. On the other hand, as illustrated in a right diagram of FIG. 7, the discharge capacity of the OCV curve 152 is a value measured with a set fully-charged state defined as 0 Ah and this fully-charge state set as a reference state. For this reason, the discharge capacity of the estimation data 144 relating to a plurality of times of traveling cannot be used in the optimization process of the OCV curve 152 in the state of raw data. For this reason, by applying voltage values of predetermined timings at the time of a plurality of times of traveling (voltage values of P1 and P2 in FIG. 7) to the OCV of the OCV curve 152 estimated by the OCV curve estimating unit 130, the OCV curve estimating unit 130 converts all the sets G1 and G2 of the estimation data 144 relating to the plurality of times of traveling into the same dimension as that of the OCV curve 152 (a discharge capacity is estimated from the fully charged state). Here, predetermined timings mean timings at which a voltage value in the time series data can be regarded as an OCV such as at the time of starting the vehicle 10, at the time of stopping at an intersection, and the like. The OCV curve estimating unit 130 stores data acquired through such conversion in the storage unit 140 as the integrated data 146. In addition, in this embodiment, although the OCV curve estimating unit 130 has been described to integrate estimation data 144 relating to a plurality of times of traveling of the vehicle 10 into the integrated data 146, a module different from the OCV curve estimating unit 130 may function as a traveling data integrating unit and generate integrated data 146.

Figure 8:
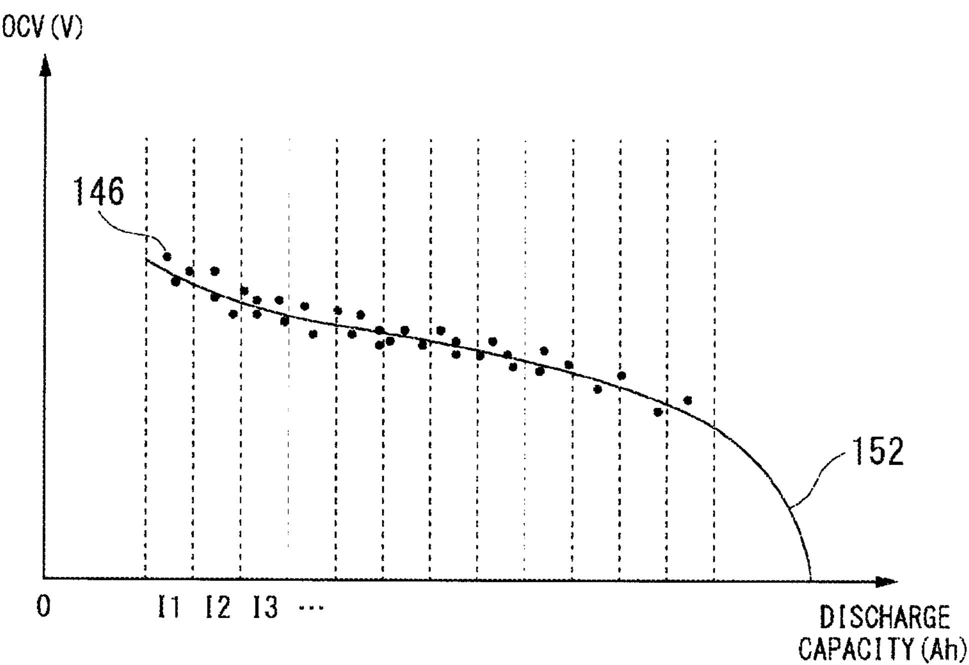
FIG. 8 is a diagram illustrating an optimization process of an OCV curve 152 that is performed by an OCV curve estimating unit 130.

FIG. 8 is a diagram illustrating an optimization process of an OCV curve 152 that is performed by the OCV curve estimating unit 130. As illustrated in FIG. 8, the OCV curve estimating unit 130 optimizes the first parameter group and the second parameter group such that a value of an error function representing error between the estimated OCV curve 152 and the integrated data 146 is a predetermined value or less. More specifically, the OCV curve estimating unit 130 optimizes the first parameter group and the second parameter group such that the value of the error function is a predetermined value or less, for example, by using a local optimization algorithm such as a BFGS method, a conjugate gradient method, and a COBYLA method or a global optimization algorithm such as a genetic algorithm, a differential evolution method, a SHGO method, or a simulated annealing method.

At this time, the OCV curve estimating unit 130 sets a function increasing in accordance with a sum value of values acquired by weighting errors between the OCV curve 152 and the integrated data 146 as an error function. More specifically, the OCV curve estimating unit 130, first, divides the discharge capacity (Ah) into predetermined intervals $I_1$, $I_2$, $I_3$, . . . and calculates data amounts $n_1$, $n_2$, $n_3$, . . . included in respective intervals. Next, by taking reciprocals of the data amounts $n_1$, $n_2$, $n_3$, . . . , the OCV curve estimating unit 130 calculates a weight $w_k$ for each interval as $w_k=(1/n_k)/(\mathrm{sum}(1/n_i))$. Next, as represented in the following Equation (1), by using the calculated weights, the OCV curve estimating unit 130 defines a weighted mean squared error (weighted RMSE) as an error function.

[Math 1]

$$\text{Weighted } RMSE = \sqrt{\frac{\sum_{i=1}^{N}(Pred_i - \mathrm{Act}_i)^2 \times w_i}{N}} \tag{1}$$

In Equation (1), $\mathrm{pred}_i$ represents an open voltage estimated value on the OCV curve 152, and $\mathrm{Act}_i$ represents an open voltage value recorded as the integrated data 146. In addition, in Equation (1), as one example, although an error is calculated by taking a square root of the mean squared error, the present invention is not limited to such a configuration, and an nth root of an arbitrary exponent of the mean squared error may be taken. As an alternative, as represented in the following Equation (2), the OCV curve estimating unit 130 may define a weighted mean absolute error (weighted MAE) as an error function using the calculated weights. By performing such weighting, the OCV curve 152 can be prevented from excessively fitting to the integrated data 146 of a section in which a data amount is large.

[Math 2]

$$\text{Weighted } MAE = \frac{\sum_{i=1}^{N}(|Pred_i - \mathrm{Act}_i| \times w_{i)}}{N} \tag{2}$$

In addition, in FIG. 8, although an example in which a data amount of the integrated data 146 is counted in each section of the discharge capacity (that is, a horizontal axis direction), and a weight $w_k$ corresponding to this section is calculated has been described, the present invention is not limited to such a configuration. For example, the data amount of the integrated data 146 may be counted in each section of the voltage (that is, a horizontal axis direction), and a weight $w_k$ corresponding to this section may be calculated. In addition, the method of calculating the weight $w_k$ is not limited to the taking of the reciprocal, and, more generally, a smaller value may be given for a section having more data amount.

[Flow of Operation]

Figure 9:
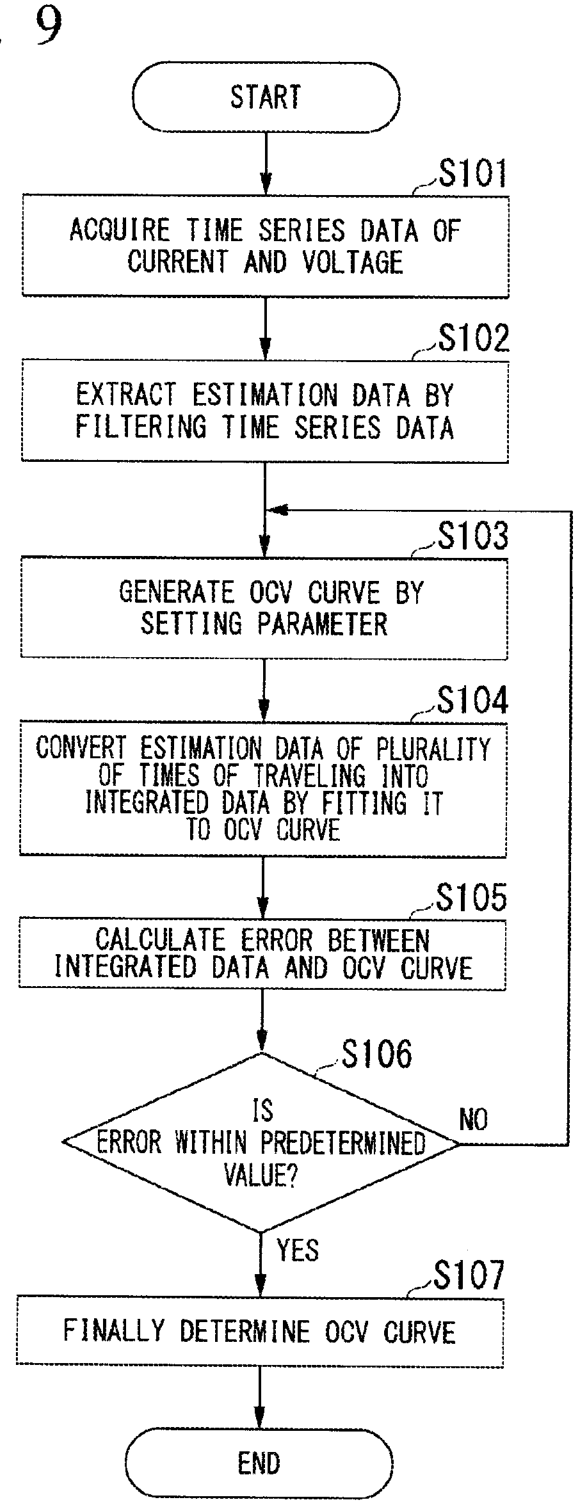
FIG. 9 is a flowchart illustrating one example of the flow of a process performed by the battery characteristic estimating device 100.

Next, the flow of the process performed by the battery characteristic estimating device 100 according to this embodiment will be described with reference to FIG. 9. FIG. 9 is a flowchart illustrating one example of the flow of the process performed by the battery characteristic estimating device 100. The process of this flowchart is defining an OCV curve 152 that becomes a fitting target of the estimation data 144 relating to a plurality of times of traveling of the vehicle 10 as an initial OCV curve by performing parameter setting of the first parameter group and the second parameter group.

First, the battery characteristic estimating device 100 acquires time series data 142 including a current value and a voltage value from the vehicle 10 (Step S101). Next, the battery characteristic estimating device 100 extracts the estimation data 144 by filtering the time series data 142 on the basis of a current value of the time series data 142 and a low current continuation time measured on the basis of the acquired current value (Step S102).

Next, by arbitrarily setting parameters of the first parameter group and the second parameter group, the battery characteristic estimating device 100 generates a positive-electrode OCP curve 148# from the reference positive-electrode OCP curve 148 and generates a negative-electrode OCP curve 150# from the reference negative-electrode OCP curve 150. By subtracting the negative-electrode OCP curve 150# from the positive-electrode OCP curve 148#, the battery characteristic estimating device 100 generates an OCV curve 152 (Step S103). Next, by applying the estimation data 144 relating to a plurality of times of traveling of the vehicle 10 to the generated OCV curve 152, the battery characteristic estimating device 100 converts the estimation data 144 into integrated data 146 (Step S104).

Next, the battery characteristic estimating device 100 calculates an error between the converted integrated data 146 and the generated OCV curve 152 (S105). Next, the battery characteristic estimating device 100 determines whether or not the calculated error is within a predetermined value (S106). In a case in which it is determined that the calculated error is not within the predetermined value, the battery characteristic estimating device 100 returns to Step S103, resets the first parameter group and the second parameter group, and generates an OCV curve 152. On the other hand, in a case in which it is determined that the calculated error is within the predetermined value, the battery characteristic estimating device 100 finally determines this OCV curve 152 as a final OCV curve 152 (S105). In accordance with this, the process of this flowchart ends.

Next, another example of the flow of the process performed by the battery characteristic estimating device 100 according to this embodiment will be described with reference to FIG. 10. FIG. 10 is a flowchart illustrating another example of the flow of the process performed by the battery characteristic estimating device 100. The process of this flowchart is defining an OCV curve 152 that becomes a fitting target of the estimation data 144 relating to a plurality of times of traveling of the vehicle 10 using estimation data 144 of one time of traveling. This estimation data 144 of one time of traveling is one example "a data group at the time of specific traveling".

First, the battery characteristic estimating device 100 acquires time series data 142 including a current value and a voltage value from the vehicle 10 (Step S201). Next, the battery characteristic estimating device 100 extracts the estimation data 144 by filtering the time series data 142 on the basis of a current value of the time series data 142 and a low current continuation time measured on the basis of the acquired current value (Step S202).

Next, the battery characteristic estimating device 100 estimates an OCV curve 152 on the basis of the estimation data 144 relating to one time of traveling of the vehicle 10 (Step S203). More specifically, by minimizing an error function between the estimation data 144 and the OCV curve 152 using an algorithm such as the differential evolution method or the like described above, the battery characteristic estimating device 100 generates an OCV curve 152. Next, by applying the estimation data 144 relating to a plurality of times of traveling of the vehicle 10 to the generated OCV curve 152, the battery characteristic estimating device 100 converts the estimation data 144 into integrated data 146 (Step S204).

Next, the battery characteristic estimating device 100 calculates an error between the converted integrated data 146 and the generated OCV curve 152 (S205). Next, the battery characteristic estimating device 100 determines whether or not the calculated error is within a predetermined value (S206). In a case in which it is determined that the calculated error is not within the predetermined value, the battery characteristic estimating device 100 updates the first parameter group and the second parameter group and re-generates the OCV curve 152 (S207). Next, the battery characteristic estimating device 100 returns to the process of Step S205 and calculates an error between the integrated data 146 and the re-generated OCV curve 152.

On the other hand, in a case in which it is determined that the calculated error is within the predetermined value, the battery characteristic estimating device 100 finally determines this OCV curve 152 as a final OCV curve 152 (S208). In accordance with this, the process of this flowchart ends.

According to this embodiment described as above, the battery characteristic estimating device 100 sets only time series data in which a voltage value can be regarded as an OCV out of time series data 142 of the battery 40 acquired from the vehicle 10 as estimation data 144, and, by performing an optimization process between the integrated data 146 acquired by integrating the estimation data 144 relating to a plurality of times of traveling of the vehicle 10 and the estimated OCV curve 152, a final OCV curve 152 for estimating the characteristics of the battery 40 is finally determined. In accordance with this, the characteristics of the battery can be estimated with high accuracy.

The embodiment described above can be represented as below.

A battery characteristic estimating device configured to include a storage device storing a program and a hardware processor and, by executing the program stored in the storage device using the hardware processor, acquire time series data including at least a current value and a voltage value of a battery, extract data in which a voltage change due to charging/discharging is small from the acquired time series data described above as estimation data, and estimate an OCV curve representing an open circuit voltage for a discharge capacity calculated on the basis of the above-described current value of the battery described above on the basis of the above-described estimation data extracted by the data filtering unit described above.

As above, although a form for performing the present invention has been described using the embodiment, the present invention is not limited at all to such an embodiment, and various modifications and substitutions can be made within a range not departing from the concept of the present invention.

REFERENCE SIGNS LIST

10 Vehicle
12 Motor
14 Drive wheel
16 Brake device
20 Vehicle sensor
30 PCU
32 Converter
34 VCU
36 Control unit
40 Battery
42 Battery sensor
50 Communication device
100 Battery characteristic estimating device
110 Acquisition unit
120 Data filtering unit
130 OCV curve estimating unit
140 Storage unit

What is claim is:

1. A battery characteristic estimating device comprising:

an acquisition unit configured to acquire time series data including at least a current value and a voltage value of a battery;

a data filtering unit configured to extract data in which a voltage change due to charging/discharging is small from the acquired time series data as estimation data;

an OCV curve estimating unit configured to estimate an OCV curve representing an open circuit voltage for a discharge capacity calculated on the basis of the current value of the battery on the basis of the estimation data extracted by the data filtering unit; and a traveling data integrating unit configured to integrate the estimation data at times of a plurality of times of traveling of a vehicle in which the battery is mounted, wherein the traveling data integrating unit uses an initial OCV curve or an OCV curve estimated from a data group at the time of specific traveling and a voltage value of a timing at which the voltage value can be regarded as an open circuit voltage at the times of the plurality of times of traveling to select representative points from the estimation data acquired at each of the plurality of times of traveling of the vehicle, and applies the estimation data to the initial OCV curve or the OCV curve with the representative points serving as a reference to estimate discharge capacity values of the estimation data of the plurality of times of traveling and integrate the estimation data at the times of the plurality of times of traveling, and wherein the OCV curve estimating unit estimates the OCV curve by performing optimization calculation such that a value of an error function calculated on the basis of the estimated OCV curve and the estimation data integrated by the traveling data integrating unit is a threshold or less.

2. The battery characteristic estimating device according to claim 1, wherein the OCV curve estimating unit estimates the OCV curve by performing optimization calculation such that a value of an error function calculated on the basis of the estimated OCV curve and the estimation data is a threshold or less, wherein the error function is a function increasing in accordance with a sum value of values acquired by applying weights to errors between the estimated OCV curve and the estimation data, and wherein a data number of pieces of the estimation data extracted by the data filtering unit is counted for a plurality of sections of a discharge capacity or a voltage value, and the weight is set such that a value of the weight corresponding to a section becomes smaller as the counted data number becomes larger.

3. The battery characteristic estimating device according to claim 1, wherein the OCV curve estimating unit uses the estimation data to convert a reference positive-electrode OCP curve, which represents an open circuit electric potential for a discharge capacity of a positive electrode with a normalized width of the discharge capacity, and a reference negative-electrode OCP curve, which represents an open circuit electric potential for a discharge capacity of a negative electrode with a normalized width of the discharge capacity, into a positive-electrode OCP curve representing an open circuit electric potential for a discharge capacity of the positive electrode of the battery and a negative-electrode OCP curve representing an open circuit electric potential for a discharge capacity of the negative electrode of the battery, and estimates the OCV curve by subtracting the negative-electrode OCP curve from the positive-electrode OCP curve.

4. The battery characteristic estimating device according to claim 1, wherein the data filtering unit extracts time series data in which a low current continuation time that is a time at which the current value represents a value equal to or smaller than a first threshold is a second threshold or more as the estimation data in which the voltage change is small.

5. The battery characteristic estimating device according to claim 4, wherein the time series data includes a temperature of the battery, and wherein the data filtering unit increases a value of the second threshold in a case in which the temperature is a third threshold or less.

6. The battery characteristic estimating device according to claim 1, wherein the data filtering unit extracts time series data in which the current value is a fourth threshold or less as the estimation data in which the voltage change is small.

7. The battery characteristic estimating device according to claim 1, wherein the data filtering unit extracts time series data in which a differential value of the voltage value is a fifth threshold or less as the estimation data in which the voltage change is small.

8. A battery characteristic estimating method using a computer, the battery characteristic estimating method comprising:

acquiring time series data including at least a current value and a voltage value of a battery;

extracting data in which a voltage change due to charging/discharging is small from the acquired time series data as estimation data;

estimating an OCV curve representing an open circuit voltage for a discharge capacity calculated on the basis of the current value of the battery on the basis of the estimation data;

integrating the estimation data at times of a plurality of times of traveling of a vehicle in which the battery is mounted;

using an initial OCV curve or an OCV curve estimated from a data group at the time of specific traveling and a voltage value of a timing at which the voltage value can be regarded as an open circuit voltage at the times of the plurality of times of traveling to select representative points from the estimation data acquired at each of the plurality of times of traveling of the vehicle, and applying the estimation data to the initial OCV curve or the OCV curve with the representative points serving as a reference to estimate discharge capacity values of the estimation data of the plurality of times of traveling and integrate the estimation data at the times of the plurality of times of traveling; and estimating the OCV curve by performing optimization calculation such that a value of an error function calculated on the basis of the estimated OCV curve and the estimation data is a threshold or less.

9. A non-transitory computer-readable storage medium having stored thereon a program causing a computer to:

acquire time series data including at least a current value and a voltage value of a battery;

extract data in which a voltage change due to charging/discharging is small from the acquired time series data as estimation data;

estimate an OCV curve representing an open circuit voltage for a discharge capacity calculated on the basis of the current value of the battery on the basis of the estimation data;

integrate the estimation data at times of a plurality of times of traveling of a vehicle in which the battery is mounted;

use an initial OCV curve or an OCV curve estimated from a data group at the time of specific traveling and a voltage value of a timing at which the voltage value can be regarded as an open circuit voltage at the times of the plurality of times of traveling to select representative points from the estimation data acquired at each of the plurality of times of traveling of the vehicle, and apply the estimation data to the initial OCV curve or the OCV curve with the representative points serving as a reference to estimate discharge capacity values of the estimation data of the plurality of times of traveling and integrate the estimation data at the times of the plurality of times of traveling; and estimate the OCV curve by performing optimization calculation such that a value of an error function calculated on the basis of the estimated OCV curve and the estimation data is a threshold or less.

* * * * *